United States Patent
Joffe

(10) Patent No.: US 10,079,645 B2
(45) Date of Patent: Sep. 18, 2018

(54) OPTICAL TELECOMMUNICATIONS DEVICES, SYSTEMS, AND METHODS

(71) Applicant: Adtran, Inc., Huntsville, AL (US)

(72) Inventor: Daniel M. Joffe, Huntsville, AL (US)

(73) Assignee: ADTRAN, Inc., Huntsville, AL (US)

(*) Notice: Subject to any disclaimer, the term of this patent is extended or adjusted under 35 U.S.C. 154(b) by 0 days.

(21) Appl. No.: 15/383,175

(22) Filed: Dec. 19, 2016

(65) Prior Publication Data
US 2017/0195063 A1    Jul. 6, 2017

Related U.S. Application Data

(60) Provisional application No. 62/273,586, filed on Dec. 31, 2015.

(51) Int. Cl.
*H04B 10/69* (2013.01)
*H04B 10/67* (2013.01)
(Continued)

(52) U.S. Cl.
CPC ............ *H04B 10/673* (2013.01); *H03F 3/04* (2013.01); *H04B 10/07953* (2013.01);
(Continued)

(58) Field of Classification Search
CPC .............. H04B 10/504; H04B 10/6932; H04B 10/6971
See application file for complete search history.

(56) References Cited

U.S. PATENT DOCUMENTS

| 5,883,910 A * | 3/1999 | Link ................... H01S 5/042 |
| | | 372/34 |
| 8,346,098 B2 * | 1/2013 | Feng ................... H04B 10/69 |
| | | 398/202 |

(Continued)

FOREIGN PATENT DOCUMENTS

| CN | 104508977 A | 4/2015 |
| EP | 2337254 A1 | 6/2011 |

(Continued)

OTHER PUBLICATIONS

International Search Report and Written Opinion issued in International Application No. PCT/US2016/067719 dated May 23, 2017, 20 pages.

(Continued)

*Primary Examiner* — Shi K Li
(74) *Attorney, Agent, or Firm* — Fish & Richardson P.C.

(57) ABSTRACT

Optical telecommunications devices, systems, and methods. In some implementations, an optical networking unit (ONU) includes a multi-rate receiver having an operating bandwidth that is selected operationally based on physical layer characteristics of received signals and information received from a MAC. The ONU can also include an upstream laser circuit having an output impedance that differs from a characteristic impedance of a system in which the laser circuit is implemented. The ONU can also include a decision feedback equalizer (DFE) having at least one tap weight that is fixed to facilitate convergence of the DFE when signals received by the DFE would otherwise fail to meet characteristics required for DFE convergence.

15 Claims, 5 Drawing Sheets

(51) Int. Cl.
*H03F 3/04* (2006.01)
*H04B 10/079* (2013.01)
*H04B 10/27* (2013.01)
*H04L 25/03* (2006.01)
*H04B 10/272* (2013.01)

(52) U.S. Cl.
CPC .......... *H04B 10/27* (2013.01); *H04B 10/272* (2013.01); *H04B 10/69* (2013.01); *H04L 25/03057* (2013.01); *H03F 2200/129* (2013.01); *H05K 999/99* (2013.01)

(56) References Cited

U.S. PATENT DOCUMENTS

| | | | |
|---|---|---|---|
| 8,798,484 | B2 | 8/2014 | Proesel et al. |
| 8,953,952 | B2 | 2/2015 | Proesel et al. |
| 8,977,138 | B2 | 3/2015 | Proesel et al. |
| 8,994,457 | B2 | 3/2015 | Proesel et al. |
| 2005/0218563 | A1 | 12/2005 | Li Shenggao |
| 2006/0280214 | A1* | 12/2006 | Brunner ............ H03K 3/57 372/38.03 |
| 2009/0175295 | A1* | 7/2009 | Ide ............ H04L 7/08 370/465 |
| 2011/0142120 | A1* | 6/2011 | Liu ............ H04L 25/03057 375/233 |
| 2013/0064281 | A1* | 3/2013 | Raphaeli ............ H04L 25/03057 375/233 |
| 2015/0117511 | A1* | 4/2015 | Lyubomirsky .... H04L 25/03057 375/233 |

FOREIGN PATENT DOCUMENTS

| | | |
|---|---|---|
| EP | 2736182 A | 5/2014 |
| WO | 2016061748 | 4/2016 |

OTHER PUBLICATIONS

Rylyakov, et at; "A new ultra-high sensitivity, low-power optical receiver based on a decision-feedback equalizer", Optical Society of America, 2011; paper OSA/OFC/NFOEC 2011.

Proesel et al., "Optical Receivers Using DFE-IIR Equalization"; ISSCC 2013, Session 7, Optical Transceivers and Silicone Photonics, section 7.8, IEEE 978-1-4673-4516-3/13; 3 pages.

Omella et al., "10 Gb/s full-duplex bidirectional transmission with RSOA-based ONU using detuned optical filtering and decision feedback equalization", 2009 Optical Society of America; OSA, Mar. 30, 2009, vol. 17, No. 7; 6 pages.

Guo, Yong et al., "Demonstration of 10G burst-Mode DML and EDC in Symmetric 40Gbit/s TWDM-PON over 40km Passive Reach", Optical Society of America 2014, OSA 978-1-55752-993-0/14; 3 pages.

Parkash, Soora, "Performance Enhance of WDM-PON FTTH Network by Using Decision Feedback and Feed forward Equalizations"; International Journal of Signal Processing (IJSIP), vol. 8, No. 8, (2015), 8 pages.

\* cited by examiner

OPTICAL TELECOMMUNICATIONS DEVICES, SYSTEMS, AND METHODS

CROSS REFERENCE TO RELATED APPLICATION

This application claims priority to U.S. Provisional Application No. 62/273,586, filed on Dec. 31, 2015, the entire contents of which is hereby incorporated by reference.

BACKGROUND

This document relates to optical telecommunications apparatus and methods. Data networks are being deployed and/or upgraded to provide subscribers with access to digital content. In some situations, the entities deploying these data networks will initially install network components that provide a certain level of service (e.g., speed) that is currently desired by their subscribers, and those entities will later determine whether to replace the initially installed network components to provide a higher level of service (e.g., higher speed).

SUMMARY

In general, one innovative aspect of the subject matter described in this specification can be embodied in devices that include a multi-rate receiver having an operating bandwidth that is selected operationally based on physical layer characteristics of received signals and information received from a MAC; an upstream laser circuit having an output impedance that differs from a characteristic impedance of a system in which the laser circuit is implemented; and a DFE having at least one tap weight that is fixed. Other embodiments of this aspect include corresponding systems and methods.

These and other embodiments can each optionally include one or more of the following features. The DFE can be configured to have at least one tap weight that is pre-set to ensure convergence of the DFE when characteristics of signals received from the TIA fail to meet otherwise required characteristics for DFE convergence.

The multi-rate receiver can include a TIA. Performance of the receiver at each of two or more rates is optimized by switching between two or more different feedback resistors that are connected across the TIA.

The ONU can include a processor that is configured to select which of the two or more different feedback resistors are connected across the TIA based on the physical layer characteristics of the received signals and the information received from the MAC. Circuitry connected to the DFE can be configured to provide the physical layer characteristics to the processor.

Another innovative aspect of the subject matter described in this specification can be embodied in a multi-rate receiver that includes a TIA; a set of selectable feedback resistors connected across the TIA; and a microprocessor that selects a feedback resistor from the set based on physical characteristics of received signals and information received from a MAC. Other embodiments of this aspect include corresponding systems and methods.

These and other embodiments can each optionally include one or more of the following features. The set of selectable feedback resistors can include a narrow-band feedback resistor and a wide-band feedback resistor. The microprocessor can receive the physical characteristics from circuitry connected to an input of the DFE. The physical characteristics can include an eye-opening measure.

Another innovative aspect of the subject matter described in this specification can be embodied in an upstream laser circuit that includes a laser driver; an output laser; and an impedance element connected between the laser driver and the output laser, the impedance element having an impedance that differs from a characteristic impedance of a system in which the laser circuit is implemented. Other embodiments of this aspect include corresponding systems and methods.

These and other embodiments can each optionally include one or more of the following features. The laser driver can have a specified nominal operating range up to 10 Gbps, and is configured to drive the laser, wherein the laser has a specified nominal operating range up to 1.25 Gbps.

The impedance element can be selected based, at least in part, on a parasitic inductance of conductors that connect the output laser to an electrical interface of a chip housing the output laser. A pole created by the parasitic inductance and the impedance element can be at a frequency that exceeds a specified operating range of the output laser.

Another innovative aspect of the subject matter described in this specification can be embodied in a receiver that includes a TIA having an operating bandwidth that is less than a data rate of data received at the TIA; and a DFE having at least one tap weight that is pre-set to ensure convergence of the DFE when characteristics of signals received from the TIA fail to meet required characteristics for DFE convergence. Other embodiments of this aspect include corresponding systems and methods.

These and other embodiments can each optionally include one or more of the following features. At least one tap weight can be associated with a second tap, and the second tap can be pre-set and fixed at a maximum weight. At least one tap weight can be pre-set to facilitate convergence of the DFE when signals received from the TIA have less than a specified eye opening.

Another innovative aspect of the subject matter described in this specification can be embodied in a method that includes the actions of obtaining physical layer characteristics from signals input to a DFE or output from the DFE; obtaining quality of service information from a MAC; determining a data rate of received communications based on the physical layer characteristics and the quality of service information; and automatically connecting one of multiple different feedback resistors across a TIA based on the determination. Other embodiments of this aspect include corresponding systems and devices.

These and other embodiments can each optionally include one or more of the following features. Connecting one of multiple different feedback resistors across the TIA can include connecting a narrow-band feedback resistor across the TIA when the data rate is determined to be less than a higher supported data rate; and connecting a wide-band feedback resistor across the TIA when the data rate is determined to be at the higher supported data rate. The physical layer characteristics can include one or more of a measure of the eye opening of signals received at the DFE, an amount of time between signal transitions, a number of signal transitions detected over a given amount of time, or a signal to noise measure for signals received at the DFE. The quality of service information can include one or more of a dropped packets count, a dropped packets rate, a frame error rate, or a bit error rate.

Particular embodiments of the subject matter described in this specification can be implemented so as to realize one or more of the following advantages. Data rates provided by an optical system can exceed the specified operating ranges of the optical components used to implement the optical system. For example, 10 Gbps downstream communications (e.g., to the subscriber) can be realized using 2.5 Gbps receiver optical components, and 10 Gbps upstream communications (e.g., to the service provided) can be realized using 1.25 Gbps transmitter optical components. Multi-rate transmissions can be supported by automatically switching between two or more selectable rates based on characteristics of received signals and/or information received from a media access controller (MAC).

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

The subject matter described in this document relates to optical telecommunications systems, devices, and methods that provide optical communication rates exceeding the specified operating range of the individual communications components by multiples (e.g., 2-8 times the specified operating range of the individual optical communications components). In some situations, 10 Gbps rates can be realized using optical components that have been rated for operation at 2.5 Gbps or 1.25 Gbps. The optical telecommunications systems can also be implemented to support multiple different communication rates (e.g., 2.5 Gbps and 10 Gbps downstream and/or 1.25 Gbps and 10 Gbps upstream) to provide multiple different levels of service with the same set of equipment.

In some implementations, an optical networking unit (ONU) includes a multi-rate receiver, a decision feedback equalizer (DFE), and an upstream laser circuit having an upstream laser that is driven at a rate that is multiple times higher than a specified nominal operating range of the upstream laser. As discussed in more detail below with reference to the figures, the multi-rate receiver includes, for example, a trans-impedance amplifier (TIA), a set of selectable feedback resistors that are connected across the TIA, and a microprocessor that selects a feedback resistor to set the data rate of the receiver. The DFE is generally configured to have at least one tap weight that is fixed to enable the DFE to converge even when signals received from the TIA would otherwise fail to meet characteristics required for DFE convergence. The upstream laser circuit can include a laser driver, an output laser, and an impedance element that sets the output impedance of the laser drive circuit at a value that differs from a characteristic impedance of the system in which the laser circuit is implemented. In some implementations, the output impedance of the laser driver is selected based, at least in part, on a parasitic inductance of the upstream laser circuit so that a pole created by the parasitic inductance is at a high enough frequency to support data rates beyond the specified operating range of the laser.

Figure 1:
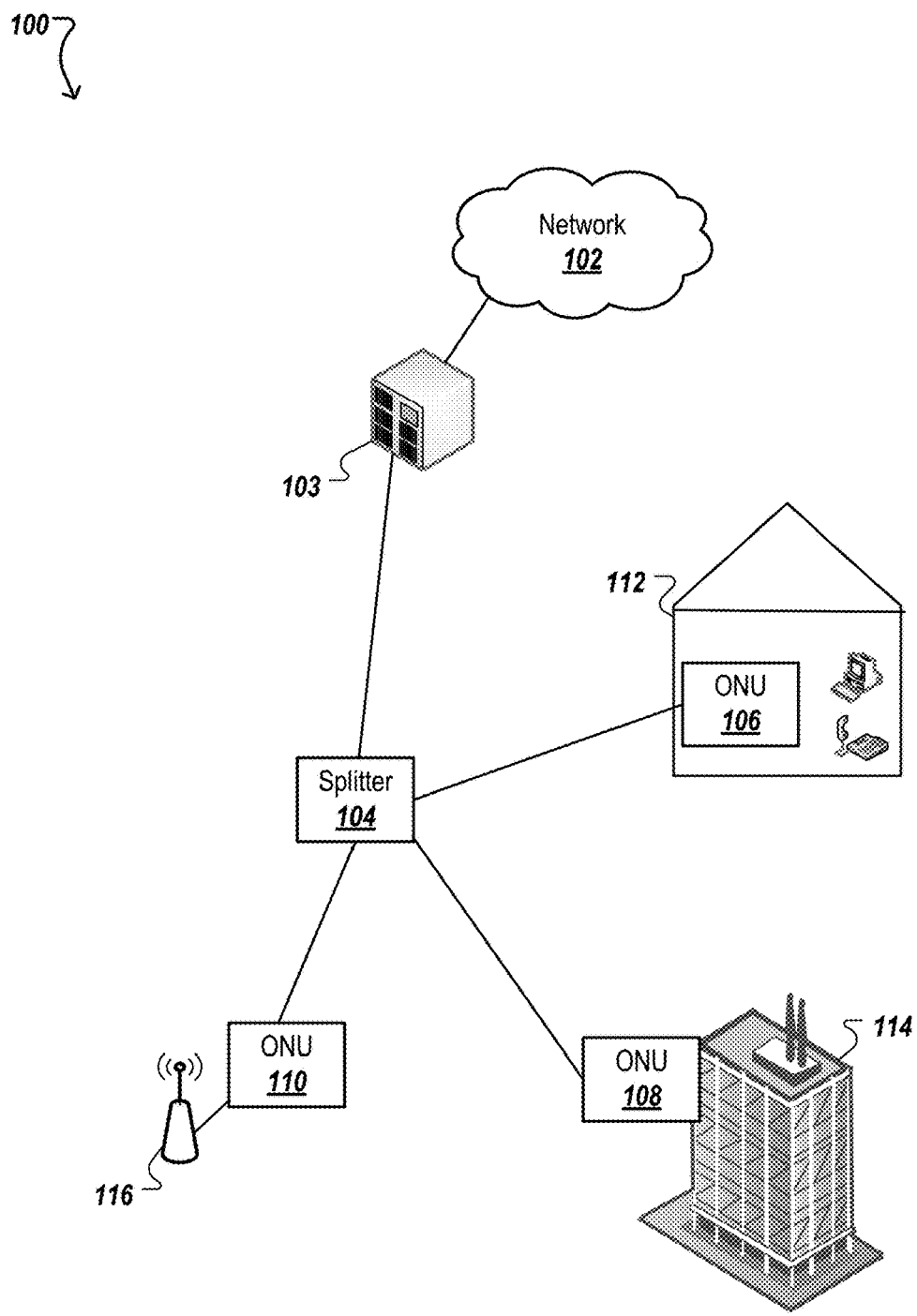
FIG. 1 is a block diagram of an example optical networking environment.

FIG. 1 is a block diagram of an example optical networking environment 100. The optical networking environment 100 can include, for example, a passive optical network (PON) that connects users to a larger network 102, such as the Internet, a public switched telephone network (PSTN), a data server, a video server, or additional or different networks. The environment 100 can also include one or more active optical networks (AONs), or another type of network that provides network services (e.g., ADSL2+, VDSL2, etc.), or a combination of these and other technologies.

A passive optical network (PON) can include one or more network distribution elements (or central office nodes), a number of user network elements or user nodes, and one or more unpowered optical splitters that enable a single optical fiber to serve multiple customer premises. As shown in FIG. 1, a PON can include an optical line terminal (OLT) 103 at a service provider's central office (or other distribution point). Using a splitter 104, the OLT 103 is coupled to a number of optical network units (ONUs) 106, 108, and 110 (also referred to as optical network terminals (ONTs)), which are located near end users, thereby forming a point-to-multipoint network. For example, in the case of Gigabit Passive Optical Network (GPON), a single OLT port can connect to 64 different ONUs through the splitter 104. Note that a telecommunications network can include additional and/or different components and features, and can be configured in a different manner (e.g., in bus, ring, or other topologies) than the example network 100 shown in FIG. 1.

The OLT 103, as a network distribution element, provides an interface between the PON and a core network, and serves as the service provider's endpoint of the PON. The OLT 103 transmits downstream data traffic to ONUs (e.g., ONUs 106, 108, and 110), and receives upstream data traffic from the ONUs.

Each ONU can include or otherwise be coupled to one or more customer-premises equipment (CPE) or subscriber devices (e.g., CPE modems). The ONU is a device that terminates the PON at the customer end, and provides a service connection to the user. For example, the ONU terminates the optical fiber transmission and can transform incoming optical signals into electrical signals adapted to subscriber devices. ONUs can provide network services, for example, to residential locations 112, business locations 114, or other forms of communications infrastructure, such as wireless communications equipment 116.

In some situations, an entity that deploys a PON will make decisions regarding the level of service that will be provided over the PON based on current or near-term demand in the area, and therefore may install a PON that provides data rates below that which could have been provided using higher priced equipment. For example, based on an analysis of the demand in a given area, a service provider may deploy a PON using optical telecommunications equipment that supports up to 2.5 Gbps downstream communications and up to 1.25 Gbps upstream communications even though equipment that supports bi-directional communications up to 10 Gbps is available. In this situation, if the demand for higher data rates increases in that given area, the service provider will generally be required to replace their initially installed equipment in order to provide the increased data rates. This can lead to network downtime, potentially lost revenues, and potential customer satisfaction issues (e.g., due to downtime and/or delays in providing the higher data rates).

The optical telecommunications devices and systems discussed below can achieve up to 10 Gbps bi-directional data rates using components that are only rated to support 2.5 Gbps data rates. Additionally, the devices and systems discussed below can be implemented as multi-rate devices, such that a service provider can initially deploy a network that provides an initial data rate (e.g., 2.5 Gbps downstream/1.25 Gbps upstream), and can later provide increased data rates (e.g., 10 Gbps downstream/10 Gbps upstream) without having to swap out hardware. This multi-rate capability can also enable the service provider to simultaneously support multiple different levels of service with the same equipment. The following examples and descriptions refer to technology implemented in an ONU. However, the descriptions that follow can be applied to other types of optical telecommunications equipment.

Figure 2:
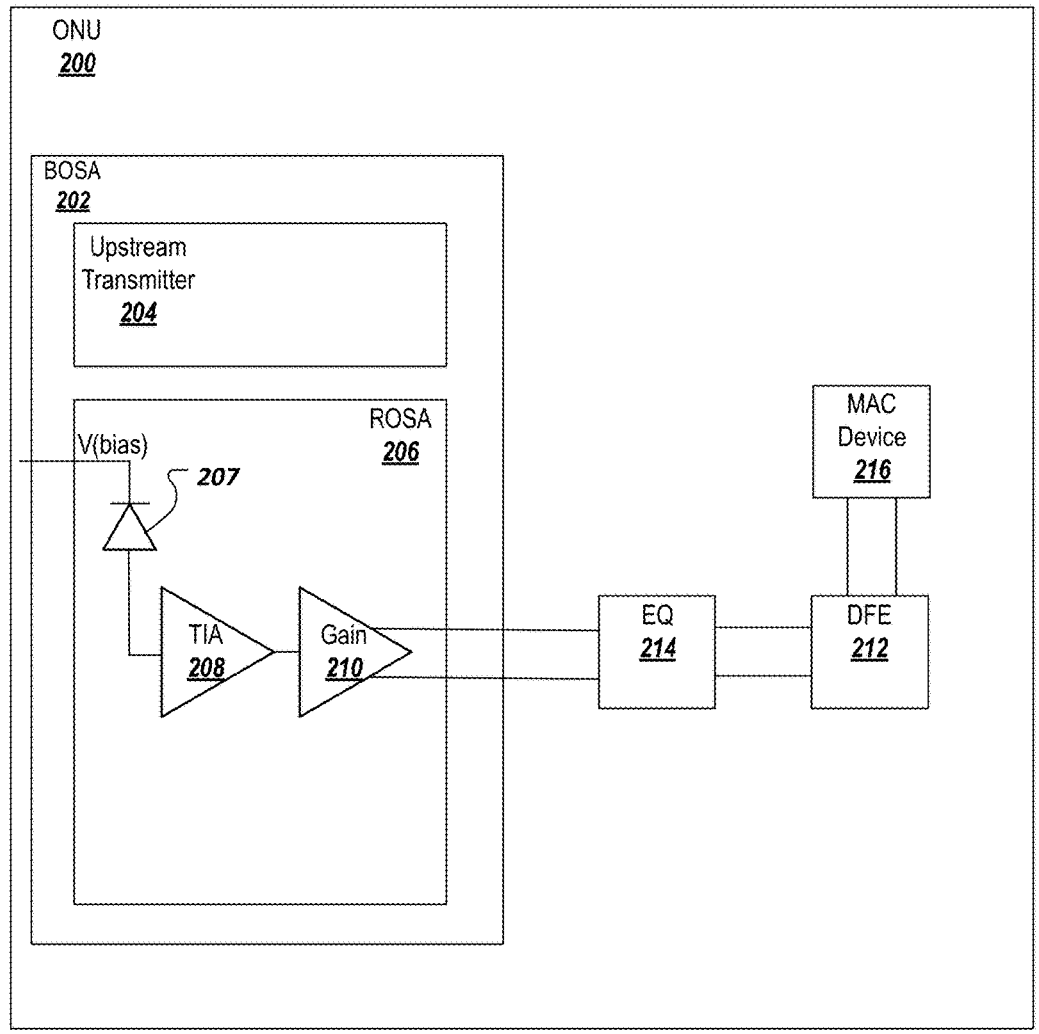
FIG. 2 is a block diagram of an example Optical Networking Unit (ONU).

FIG. 2 is a block diagram of an example ONU 200. The example ONU 200 implemented in the manner discussed below can support data rates that are multiples (e.g., up to 4× or 8×) of the data rates supported by the optical components used in the ONU 200. For example, the ONU 200 can support up to 10 Gbps bi-directional data rates using optical components that have been rated for use in 2.5 Gbps downstream/1.25 Gbps upstream applications.

The ONU 200 includes a bi-directional optical sub-assembly (BOSA) 202, which facilitates transmission of data upstream using an upstream transmitter 204 (discussed with reference to FIGS. 4A-4C), and a receiver optical sub-assembly (ROSA) 206. The ROSA 206 includes a reverse biased photodiode 207, which is connected to a trans-impedance amplifier (TIA) 208. In turn, the TIA 208 is connected to a gain amplifier 210, which increases the amplitude of the TIA 208 and outputs a differential electrical signal. In operation, the ROSA 206 receives an optical signal as input, and outputs a differential electric signal. Generally, the ROSA 206 has a specified operational range (e.g., specified maximum data rate) that is based on the components (e.g., photodiode, TIA feedback impedance, etc.) used to implement the ROSA 206. For example, one ROSA 106 can have a specified operational range of 2.5 Gbps, while another ROSA may have a specified operational range of 10 Gbps.

When the specified operational range of a given ROSA is exceeded, the quality of the electrical signals output by the ROSA will degrade. For example, when the data rate of optical signals received by the ROSA 206 exceed its specified data rate (e.g., 2.5 Gbps), an "eye opening" of the electrical data output from the ROSA 206 will close. As some point beyond the rated data rate, the "eye opening" of the electrical data output from the ROSA 206 closes to the point that the electrical output of the ROSA 206 can no longer be used to recover clock and data from the signal received by the ROSA 206. As such, telecommunications device/system designers generally specify a ROSA 206 having a specified operational range that matches (or exceeds) the data rates that will be supported by the telecommunications device/system. However, extending the actual operating range of a given ROSA beyond its specified operating range can enable the ROSA to be used in higher data rate applications. This can lower the cost of deploying higher data rate networks by using lower cost telecommunications components in higher data rate applications.

The actual operating range of the ROSA 206 can be extended beyond its specified operating range by coupling the output of the ROSA 206 to a decision feedback equalizer (DFE) 212, which can be used to enhance the signals output by the ROSA 206, as discussed in more detail below. In some implementations, the electrical signals output by the ROSA 206 can be conditioned by an equalizer 214 prior to being input to the DFE 212. The equalizer 212 can be configured, for example, to whiten the noise of the electrical signals output by the ROSA 206, which increases the ability of the DFE to enhance the signals output by the ROSA 206.

Generally, a DFE enhances (e.g., opens the eye of) the electrical signal output by the ROSA 206 based on the principal that once the value of a given symbol (e.g., one or more bits) has been determined, the intersymbol interference (ISI) of that symbol can be removed from later received symbols. The DFE is generally realized as a filter structure having a given number of taps, which is selected to cover the length of the channel impulse response. When implemented, the tap weights converge to their respective weight values based on the ISI contributions noted above. Note that use of a DFE allows for a higher feedback resistor to be used across the TIA (e.g., relative to the feedback resistor used when the DFE is not used), which lowers the noise and improves the performance of the ROSA.

When the quality of the electrical signals output by the ROSA 206 are degraded beyond a certain point (e.g., less than a specified eye opening), the DFE 212 is unable to automatically converge. For example, when the data rate of a signal received by the ROSA 206 is a multiple (e.g., 4×) of the specified data rate for the ROSA 206, the DFE 212 will generally be unable to automatically converge. In these situations, the DFE 212 can be modified to enable convergence of the DFE. For example, when physical characteristics of signals received from the ROSA 206 (e.g., output by the TIA 208) fail to meet required characteristics for DFE convergence, at least one tap of the DFE 212 can be initially set to its maximum weight, which will facilitate convergence of the remaining tap weights within the DFE 212 using the degraded signals. In a particular example, the second tap (e.g., from the center) of the DFE 212 can be set to and/or fixed at its maximum weight to facilitate convergence of the remaining taps of the DFE 212. In some implementations, the first tap of the DFE 212 can additionally be set near (e.g., within a specified amount of) its maximum weight to help facilitate convergence of the DFE 212. Modifying the DFE 212 in this manner enables the DFE to converge even when data rates of received communications are multiples (e.g., 4×) of the specified data rate of the ROSA 206. As such, the modified DFE 212 can be used to enable 10 Gbps communications using a ROSA 206 that has been rated for use in 2.5 Gbps optical systems. The electrical output of the DFE 212 is then passed to a media access controller (MAC) device 214 for processing.

Figure 3:
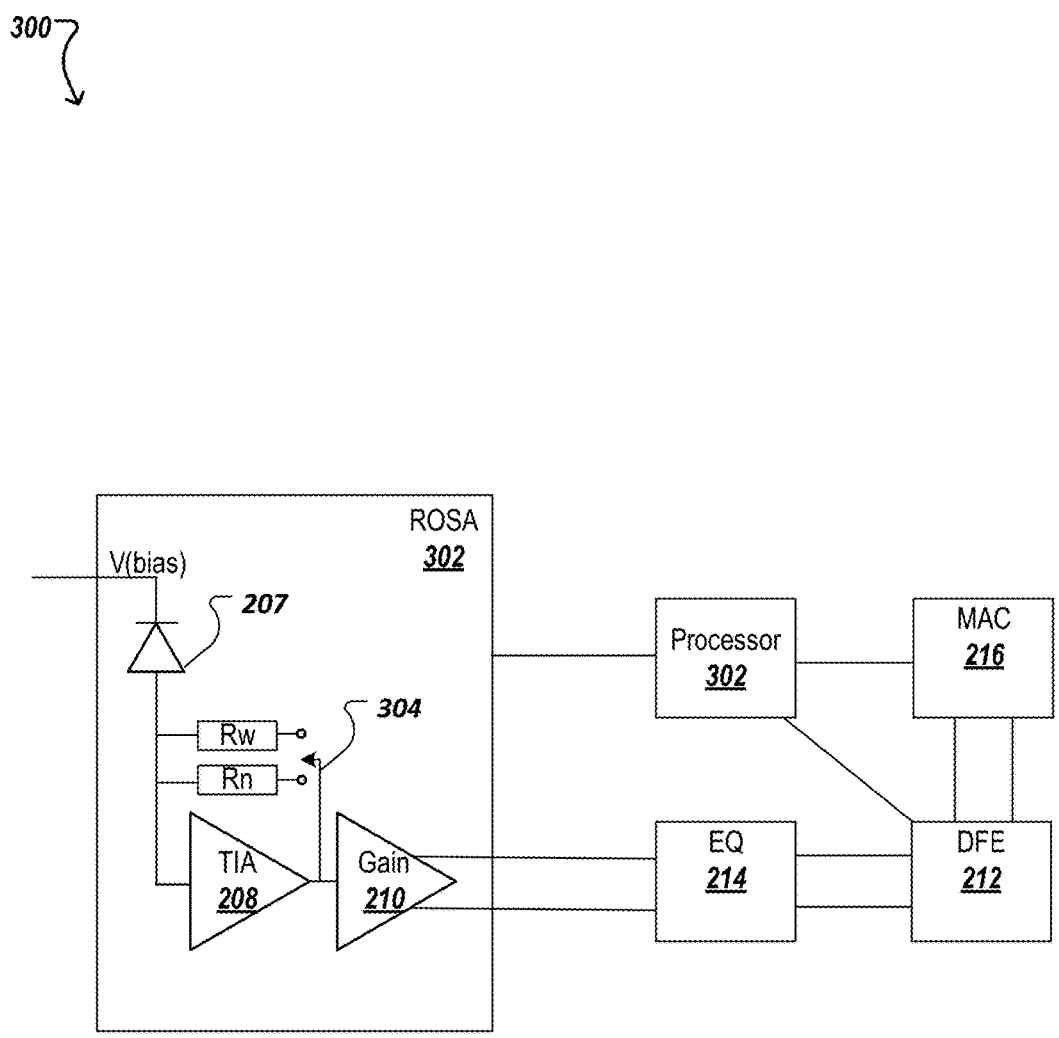
FIG. 3 is a block diagram of a multi-rate receiver circuit.

FIG. 3 is a block diagram of an example multi-rate receiver circuit 300. The muti-rate receiver circuit 300 includes a ROSA 302 that is similar to the ROSA 206 discussed above, as it includes the photodiode 207, the TIA 208, and the gain amplifier 210. However, the ROSA 302 also includes two selectable feedback resistors Rw and Rn. The feedback resistors Rw and Rn are switchable, and can be selected based on the data rates being received by the ROSA 302. For example, the feedback resistor Rw can be operationally selected (e.g., electrically connected across the TIA 208) to optimize performance of the ROSA 302 when the data rate of signals received by the ROSA are 10 Gbps, and the feedback resistor Rn can be operationally selected (e.g., electrically connected across the TIA 208) to optimize performance of the ROSA 302 when the data rate of signals received by the TIA 208 are 2.5 Gbps. Generally speaking, the values of the feedback resistors can be set based on the ratio of the data rates received by the ROSA 302. For example, in the example of 10 Gbps data rates and 2.5 Gbps data rates, the ratio of the resistor values can be set so that the value of Rw is lower than the value of Rn. Generally, the feedback resistors are each selected to optimize the performance of the TIA 208 at the respective different data rates received/supported by the multi-rate receiver 300.

In some implementations, the feedback resistor is selected from among Rw and Rn by a processor 304 (e.g., a hardware processor that executes machine readable instructions), which makes the determination as to the data rate of signals being received by the ROSA 302. The processor 304 can determine the data rate of the signals being received, for example, based on information obtained from signals input to (or output from) the DFE 212 and/or information obtained from the MAC 216. For example, the processor 304 can receive physical layer characteristics of the signals input to the DFE 212 or signals output from the DFE 212. The physical layer characteristics can include, for example, a measure of the eye opening of signals received at the DFE 212, an amount of time between signal transitions, a number of signal transitions detected over a given amount of time, and/or a signal to noise measure for signals received at (or output by) the DFE 212. The processor 304 can also receive quality of service measures from the MAC 216. The quality of service measures can include, for example, a dropped packets count, dropped packets rate, a frame error rate, a bit error rate, or other quality of service measures.

The processor 304 can evaluate the physical layer characteristics and the quality of service measures to determine the data rate of signals received by the ROSA 302. For example, when the number of signal transitions is low and the quality of service measures are high, the processor may determine that the data rate is 2.5 Gbps. Meanwhile, when the number of signal transitions is high, and the quality of service measures are acceptable (e.g., within a specified acceptable range), the processor 302 may determine that the data rate is 10 Gbps. The processor 302 can be configured to make the data rate determination, for example, based on a weighting of the physical layer characteristics and the information received from the MAC 216. For example, some information, such as the time between signal transitions may be more highly weighted (and therefore contribute more to the data rate decision) than other information, such as the signal to noise ratio.

The processor 302 uses the data rate determination to select which feedback resistor (Rw or Rn) will be connected across the TIA 208. For example, the processor 302 can be connected to a pin of the ROSA 302 that enables the processor to operate a switch 304. When the processor 302 determines that the data rate is 10 Gbps, the processor 302 generates an output signal that connects the switch 304 to the feedback resistor Rw, which configures the ROSA 302 to process a wide-band data rate (e.g., 10 Gbps) in the manner discussed above with reference to FIG. 2. Meanwhile, when the processor 302 determines that the data rate is 2.5 Gbps, the processor 302 generates an output signal that connects the switch to the feedback resistor Rn, which configures the ROSA 302 to process a narrow-band data rate. As such the ROSA 302 can be automatically configured to process wide-band data rates (e.g., 10 Gbps) or narrow-band data rates (e.g., 2.5 Gbps) based on the characteristics of the signals received by the ROSA 302.

Figure 4A:
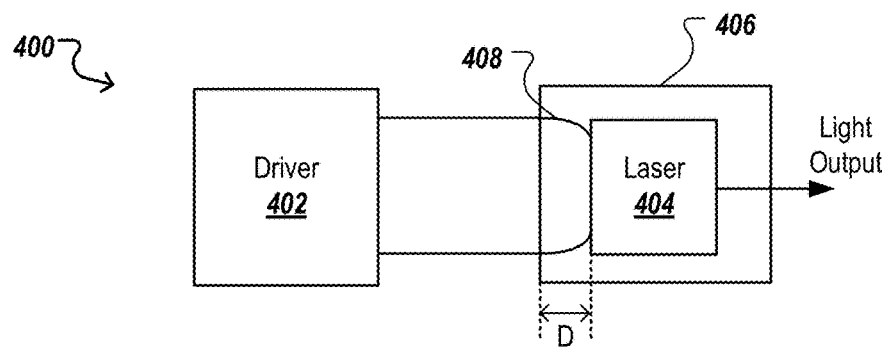
FIG. 4A is a block diagram of an example upstream laser circuit.

FIG. 4A is a block diagram of an example upstream laser circuit 400. The laser circuit 400 includes a laser driver 402 and a laser 404. The laser 404 is realized on an integrated circuit 406, which has electrical interfaces that connect to the laser driver 402. Bond wires 408 connect pads on integrated circuit 406 to the pins on a package. Those pins then connect to a laser driver. As shown in FIG. 4A, these bond wires 408 have a length of D.

Generally, upstream laser circuits are designed so that the laser driver 402 and the laser 404 have similar specified operating ranges. For example, an upstream laser circuit that supports a 1.25 Gbps data rate will generally have a laser 404 having an operating range that supports the 1.25 Gbps data rate. Similarly, the laser driver 402 in a 1.25 Gbps system will have an operating range that supports the 1.25 Gbps data rate. However, an extended range laser circuit can be designed that extends the actual operating range of the laser 404 well beyond (e.g., 4×-8× more than) the specified operating range of the laser 404. An example extended range laser circuit that supports up to 10 Gbps data rates can be realized by pairing a laser 404 having a 1.25 Gbps specified operating range with a laser driver 402 having a 10 Gbps specified operating range, as discussed in more detail below.

Figure 4B:
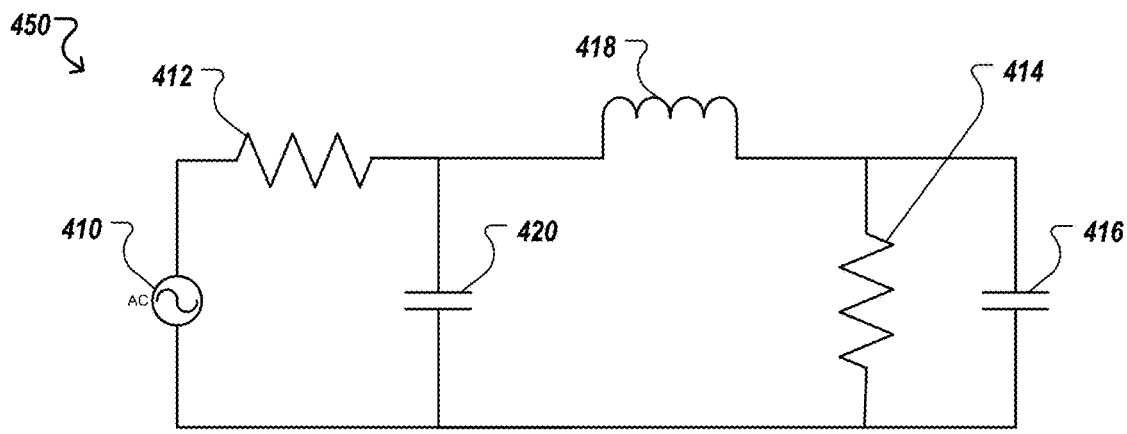
FIG. 4B is a schematic of an example upstream laser circuit.

FIG. 4B is a schematic of an example extended range upstream laser circuit 450. As shown in FIG. 4B, the laser driver 402 includes a voltage driver 410 and an output impedance 412. Meanwhile, the laser 404 is represented by a load resistor 414. In some implementations, the laser has an impedance of 5 Ohms. A shunt capacitor 416 is connected across the load resistor 414, and can have an example value of 12 pF.

Generally, the output impedance 412 of the laser driver is set to a system characteristic impedance of 25 Ohms (e.g., when using a driver 402 having a specified operating range that is paired to, or matches, the specified operating range of the laser 404). However, when attempting to drive the laser 404 many times beyond its specified operating range (e.g., using a higher rated laser driver), a parasitic inductance 418 of the conductors 408 and/or parasitic capacitance 420 of the conductors 408 create a pole that limits the actual operating range of the laser 416, even when a higher rated laser driver is used (e.g., a laser driver having a specified operating range that is multiples of the specified operating range of the laser). In a specific example, the parasitic inductance can be in the range of 5 nH, and the parasitic capacitance can be in the range of 0.5 pF.

To facilitate extended upstream data rates (e.g., data rates that are multiples of the specified operating range of the laser), the upstream laser circuit can be designed/configured to have an output impedance 412 that differs from the characteristic impedance of the system in which the laser circuit is implemented. Changing the output impedance 412 of the laser driver can move the pole created by the parasitics of the conductors to a higher frequency, thereby enabling the laser circuit to operate at data rates that are well beyond the specified operating range of the laser 404 (e.g., 4×-8× of the specified operating range of the laser).

Figure 4C:
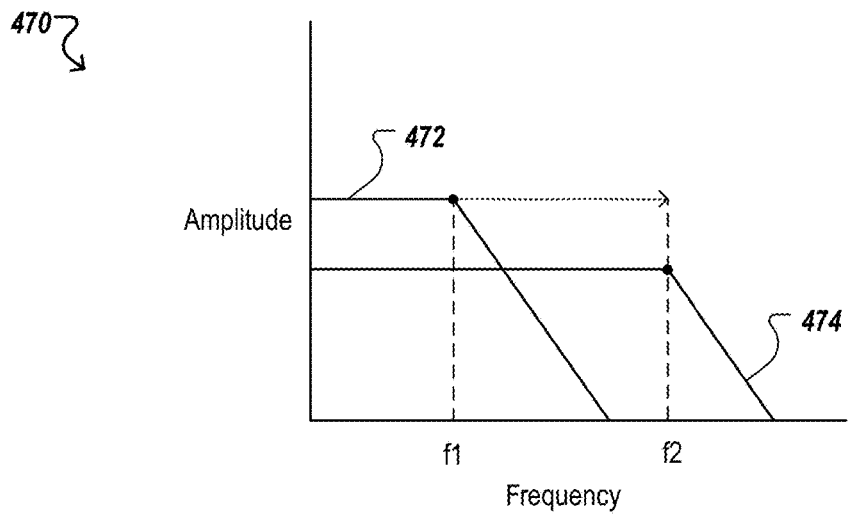
FIG. 4C is a graph showing the effect of changing the output impedance of the laser driver.

FIG. 4C is a graph showing the effect of changing the output impedance of the laser driver, as discussed above. The plot 472 represents the frequency response of the laser circuit 450 when the output impedance 412 is set to 25 Ohms (e.g., matching the system characteristic impedance), and the plot 474 represents the frequency response of the laser circuit 450 when the output impedance 412 is set to 50 Ohms (e.g., differing from the system characteristic impedance).

As shown, the pole created by the output impedance 412 of 25 Ohms and the parasitics of the conductors 408 is located at the frequency f1, and changing the output impedance to 50 Ohms shifts the pole out to f2. Changing the output impedance 412 also results in a decrease in the output amplitude, but the output amplitude is still sufficient to support the extended upstream data rates. As such, shifting the pole out to f2 enables the laser 404 to be operated at the extended data rates. Note that the discussion referencing FIGS. 4A-4C refer to an upstream laser circuit, but that this discussion is also applicable to downstream laser circuits or other laser circuits.

Referring again to FIG. 2, the example ONU 200 can be implemented using the multi-rate receiver 300 described with reference to FIG. 3, and can also be implemented using the extended range upstream laser circuit of FIG. 4B. Combining these elements together in the ONU 200 results in an ONU that provides bi-directional 10 Gbps data rates using optical components having specified operating ranges that are many times less than 10 Gbps. This enables existing (or legacy) ONU designs to be modified to realize data rates that are multiples of the current operating ranges of these existing designs, and also enables multi-rate capabilities to be supported within a single ONU, without requiring the use of the higher rated optical components. That is, the higher data rates (e.g., 10 Gbps) can be realized using the modifications discussed above rather than requiring the higher rated optical components (e.g., 10 Gbps components) to be used.

Figure 5:
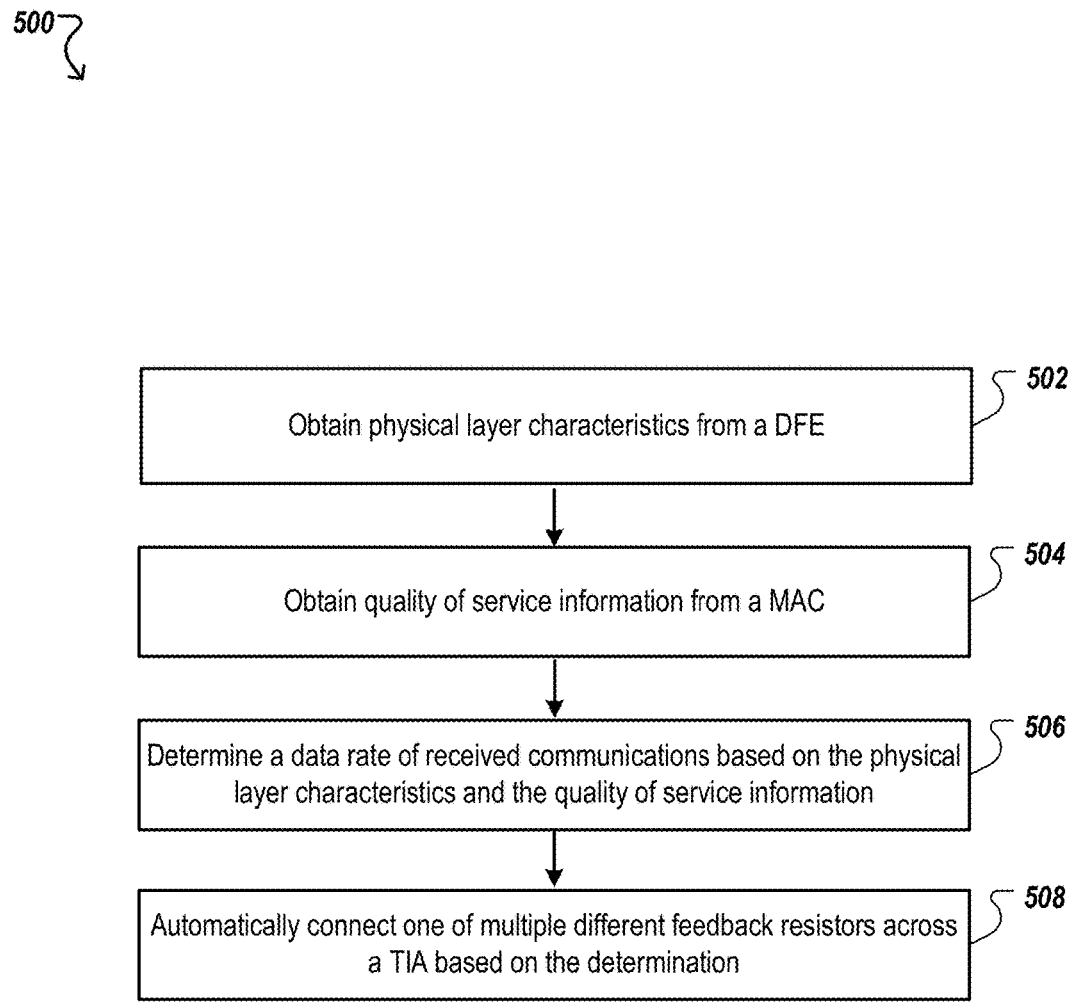
FIG. 5 is a flow chart of an example process for enabling multi-rate communications.

FIG. 5 is a flow chart of an example process 500 for enabling multi-rate communications. Operations of the process 500 can be implemented, for example, using components of the ONUs discussed above.

Physical layer characteristics of received signals are obtained (502). In some implementations, the dedicated hardware can measure, track, and/or detect the physical layer characteristics of signals that are output from a TIA and/or after processing by the equalizer and/or DFE system. For example, the hardware can determine one or more of a measure of the eye opening of signals received at the DFE (or produced at the output of the DFE), an amount of time between signal transitions, a number of signal transitions detected over a given amount of time, and/or a signal to noise measure for signals received at the DFE (or produced at the output of the DFE). In turn, the hardware, which can be connected to a processor, can provide those physical layer characteristics to the processor.

Quality of service information is obtained from a MAC (504). In some implementations, the MAC determines the quality of service information based on signals output from the DFE. For example, the MAC can process the signals output from the DFE to obtain quality of service measures including one or more of a dropped packets count, dropped packets rate, a frame error rate, a bit error rate, or other quality of service measures. One or more of these quality of service measures can be provided to the processor.

A data rate of received communications is determined based on the physical layer characteristics and the quality of service information (506). The determination can be made, for example, by the processor that obtains the information from the DFE and the MAC. The determination can be made, for example, as discussed above with reference to FIG. 3.

One of multiple different feedback resistors are automatically connected across a TIA based on the determination (508). In some implementations, the processor can output a signal to a ROSA, which causes a switch to connect either a narrow-band feedback resistor or a wide-band feedback resistor to be connected across the TIA based on the determination, as discussed above with reference to FIG. 3.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. An ONU, comprising:
a multi-rate receiver having an operating bandwidth that is selected operationally based on physical layer characteristics of received signals and information received from a MAC, the multi-rate receiver configured to:
obtain the physical layer characteristics of the received signals, wherein the received signals are input to a DFE or output from the DFE;
obtain the information from the MAC, wherein the information from the MAC is quality of service information from the MAC;
determine a data rate of received communications based on the physical layer characteristics and the quality of service information; and
automatically connect one of multiple different feedback resistors across a TIA based on the determination;
an upstream laser circuit; and
the DFE having at least one tap weight that is fixed.

2. The ONU of claim 1, wherein the DFE is configured to have at least one tap weight that is pre-set to ensure convergence of the DFE when characteristics of signals received from the TIA fail to meet required characteristics for DFE convergence.

3. The ONU of claim 1, wherein the multi-rate receiver comprises the TIA, and performance of the multi-rate receiver at each of two or more rates is optimized by switching between two or more different feedback resistors that are connected across the TIA.

4. The ONU of claim 3, further comprising a processor configured to select which of the two or more different feedback resistors are connected across the TIA based on the physical layer characteristics of the received signals and the information received from the MAC.

5. The ONU of claim 4, wherein circuitry connected to the DFE is configured to provide the physical layer characteristics to the processor.

6. A multi-rate receiver comprising:
a TIA;
a set of selectable feedback resistors connected across the TIA; and
a microprocessor that selects a feedback resistor from the set based on physical layer characteristics of received signals and information received from a MAC, the microprocessor configured to:

obtain the physical layer characteristics of the received signals, wherein the received signals are input to a DFE or output from the DFE;

obtain the information from the MAC, wherein the information from the MAC is quality of service information from the MAC;

determine a data rate of received communications based on the physical layer characteristics and the quality of service information; and automatically connect the feedback resistor from the set across the TIA based on the determination.

7. The multi-rate receiver of claim 6, wherein the set of selectable feedback resistors includes a narrow-band feedback resistor and a wide-band feedback resistor.

8. The multi-rate receiver of claim 6, wherein the microprocessor receives the physical layer characteristics from circuitry connected to an input of the DFE.

9. The multi-rate receiver of claim 6, wherein the physical layer characteristics includes an eye-opening measure.

10. A receiver having an improved operating bandwidth, comprising:

a TIA; and a DFE having at least one tap weight that is pre-set to ensure convergence of the DFE when characteristics of signals received from the TIA fail to meet required characteristics for DFE convergence, wherein the at least one tap weight is associated with a second tap, and the second tap is pre-set and fixed at a maximum weight.

11. The receiver of claim 10, wherein the at least one tap weight is pre-set to facilitate convergence of the DFE when signals received from the TIA have less than a specified eye opening.

12. A method, comprising obtaining physical layer characteristics from signals input to a DFE or output from the DFE;

obtaining quality of service information from a MAC;

determining a data rate of received communications based on the physical layer characteristics and the quality of service information; and automatically connecting one of multiple different feedback resistors across a TIA based on the determination.

13. The method of claim 12, wherein connecting one of multiple different feedback resistors across the TIA comprises:

connecting a narrow-band feedback resistor across the TIA when the data rate is determined to be less than a higher supported data rate; and connecting a wide-band feedback resistor across the TIA when the data rate is determined to be at the higher supported data rate.

14. The method of claim 12, wherein the physical layer characteristics include one or more of a measure of an eye opening of signals received at the DFE, an amount of time between signal transitions, a number of signal transitions detected over a given amount of time, or a signal to noise measure for signals received at the DFE.

15. The method of claim 12, wherein the quality of service information includes one or more of a dropped packets count, a dropped packets rate, a frame error rate, or a bit error rate.

* * * * *